(12) United States Patent
Hung et al.

(10) Patent No.: US 11,626,288 B2
(45) Date of Patent: Apr. 11, 2023

(54) INTEGRATED CONTACT SILICIDE WITH TUNABLE WORK FUNCTIONS

(71) Applicant: Applied Materials, Inc., Santa Clara, CA (US)

(72) Inventors: Raymond Hung, Palo Alto, CA (US); Mehul Naik, San Jose, CA (US); Michael Haverty, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/389,772

(22) Filed: Jul. 30, 2021

(65) Prior Publication Data

US 2023/0034058 A1 Feb. 2, 2023

(51) Int. Cl.
*H01L 21/285* (2006.01)
*H01L 29/45* (2006.01)
*H01L 29/47* (2006.01)
*H01L 29/40* (2006.01)
*H01L 29/417* (2006.01)

(52) U.S. Cl.
CPC .. *H01L 21/28537* (2013.01); *H01L 21/28568* (2013.01); *H01L 29/401* (2013.01); *H01L 29/458* (2013.01); *H01L 29/47* (2013.01); *H01L 29/41725* (2013.01)

(58) Field of Classification Search
CPC combination set(s) only.
See application file for complete search history.

(56) References Cited

U.S. PATENT DOCUMENTS 6,614,064 B1 * 9/2003 Besser .............. H01L 29/4941
257/296
10,388,748 B2 8/2019 Grupp et al.
(Continued)

FOREIGN PATENT DOCUMENTS

JP 2015-220371 A 12/2015

OTHER PUBLICATIONS

Charles M. Doland, Molybdenum Silicide Formation on Single Crystal, Polycrystalline and Amorphous Silicon: Growth, Structure and Electrical Properties, Aug. 1988, 332 pages, the Faculty of the Department of Physics University of Houston—University Park.
(Continued)

*Primary Examiner* — Mohammed R Alam
(74) *Attorney, Agent, or Firm* — Moser Taboada (57) ABSTRACT

Methods for reducing interface resistance of semiconductor devices leverage dual work function metal silicide. In some embodiments, a method may comprise selectively depositing a metal silicide layer on an Epi surface and adjusting a metal-to-silicon ratio of the metal silicide layer during deposition to alter a work function of the metal silicide layer based on whether the Epi surface is a P type Epi surface or an N type Epi surface to achieve a Schottky barrier height of less than 0.5 eV. The work function for a P type Epi surface may be adjusted to a value of approximately 5.0 eV and the work function for an N type Epi surface may be adjusted to a value of approximately 3.8 eV. The deposition of the metal silicide layer on the Epi surface may be performed prior to deposition of a contact etch stop layer and an activation anneal.

20 Claims, 8 Drawing Sheets

(56) References Cited

U.S. PATENT DOCUMENTS

| | | | |
|---|---|---|---|
| 2009/0189225 A1* | 7/2009 | Hirase | H01L 29/517 257/E21.409 |
| 2011/0127483 A1* | 6/2011 | Sonehara | G11C 13/0004 257/E45.001 |
| 2012/0083089 A1* | 4/2012 | Kim | H01L 29/7833 257/E21.409 |
| 2012/0270377 A1* | 10/2012 | Guo | H01L 29/165 438/301 |
| 2012/0285517 A1 | 11/2012 | Souza et al. | |
| 2013/0270679 A1 | 10/2013 | Yokoi et al. | |
| 2015/0262876 A1* | 9/2015 | Yang | H01L 29/6656 257/401 |
| 2016/0284811 A1 | 9/2016 | Yu et al. | |
| 2018/0350657 A1 | 12/2018 | Vats et al. | |
| 2020/0024722 A1 | 1/2020 | Yu et al. | |
| 2020/0168794 A1 | 5/2020 | Soncini et al. | |
| 2021/0074863 A1 | 3/2021 | Ohse et al. | |

OTHER PUBLICATIONS

International Search Report and Written Opinion for PCT/US2022/074146 dated Nov. 15, 2022.

* cited by examiner

INTEGRATED CONTACT SILICIDE WITH TUNABLE WORK FUNCTIONS

FIELD

Embodiments of the present principles generally relate to semiconductor manufacturing.

BACKGROUND

The speed of semiconductor devices such as metal-on-semiconductor transistors are dependent on the resistance of the source/drain contacts. The lower the resistance, the faster the speed of the transistor. Traditionally, in order to reduce the contact resistance, titanium silicide-based materials were applied to the source/drain Epi surfaces at the metal contact interface. Transistors have different compositions of materials when the transistor is a type N transistor as opposed to a type P transistor. The inventors have observed that the titanium silicide-based materials, however, are limited in that the titanium silicide-based materials are not optimal for either type of transistor and cannot be adjusted based on the transistor type. In addition, the inventors have observed that while the high resistance associated with the titanium silicide-based materials were acceptable for large scale devices, the high resistances are detrimental to smaller scale devices.

Accordingly, the inventors have provided methods for producing an enhanced interface between Epi surfaces and metal contacts, yielding improved conductivity, leading to superior performance, lower operating voltages, and faster speeds.

SUMMARY

Methods and apparatus for forming a high conductivity interfaces between Epi surfaces and metal contacts are provided herein.

In some embodiments, a method for reducing interface resistance between an Epi surface and a metal material may comprise selectively depositing a metal silicide layer on the Epi surface and adjusting a metal-to-silicon ratio of the metal silicide layer during deposition to alter a work function of the metal silicide layer based on whether the Epi surface is a P type Epi surface or an N type Epi surface to achieve a Schottky barrier height of less than approximately 0.5 eV for the P type Epi surface or the N type Epi surface.

In some embodiments, the method may further include wherein the metal silicide layer is a molybdenum silicide-based material or a ruthenium silicide-based material, wherein the work function for the P type Epi surface is adjusted to a value of approximately 5.0 eV, wherein the work function for the N type Epi surface is adjusted to a value of approximately 3.8 eV, depositing the metal silicide layer using atomic layer deposition, further adjusting the metal-to-silicon ratio by depositing on the metal silicide layer a metal or silicon using atomic layer deposition, ion implantation, or plasma vapor deposition, wherein the P type Epi surface is a silicon germanium material with or without a silicon cap layer and the N type Epi surface is a silicon phosphide material with or without a molybdenum cap layer, selectively depositing the metal silicide layer on the Epi surface prior to deposition of a contact etch stop layer and adjusting the metal-to-silicon ratio of the metal silicide layer during deposition prior to deposition of the contact etch stop layer, performing an activation anneal after adjusting the metal-to-silicon ratio, performing an activation anneal prior to selectively depositing the metal silicide layer, and/or depositing a conformal nitride-based etch stop layer on a substrate, depositing a dielectric layer on the substrate, opening a contact on the substrate, and depositing a bulk fill material onto the contact.

In some embodiments, a method for reducing interface resistance between an Epi surface and a metal material may comprise selectively depositing a molybdenum silicide layer on the Epi surface using atomic layer deposition and adjusting a metal-to-silicon ratio of the molybdenum silicide layer during deposition to alter a work function of the molybdenum silicide layer based on whether the Epi surface is a P type Epi surface or an N type Epi surface to achieve a Schottky barrier height of less than approximately 0.5 eV for the P type Epi surface or the N type Epi surface.

In some embodiments, the method may further include wherein the work function for the P type Epi surface is adjusted to a value of approximately 5.0 eV and the work function for the N type Epi surface is adjusted to a value of approximately 3.8 eV, further adjusting the metal-to-silicon ratio by depositing a molybdenum or silicon on the molybdenum silicide layer using atomic layer deposition, ion implantation, or plasma vapor deposition, wherein the P type Epi surface is a silicon germanium material with or without a silicon cap layer and the N type Epi surface is a silicon phosphide material with or without a molybdenum cap layer, selectively depositing the molybdenum silicide layer on the Epi surface prior to deposition of a contact etch stop layer and adjusting the metal-to-silicon ratio of the molybdenum silicide layer prior to deposition of the contact etch stop layer, and/or performing an activation anneal after adjusting the metal-to-silicon ratio or prior to selectively depositing the molybdenum silicide layer.

In some embodiments, a non-transitory, computer readable medium having instructions stored thereon that, when executed, cause a method for reducing interface resistance between an Epi surface and a metal material on a substrate to be performed, the method may comprise selectively depositing a metal silicide layer on the Epi surface and adjusting a metal-to-silicon ratio of the metal silicide layer during deposition to alter a work function of the metal silicide layer based on whether the Epi surface is a P type Epi surface or an N type Epi surface to achieve a Schottky barrier height of less than approximately 0.5 eV for the P type Epi surface or the N type Epi surface.

In some embodiments, the method may further include depositing the metal silicide layer using atomic layer deposition and adjusting the metal-to-silicon ratio by depositing on the metal silicide layer a metal or silicon using atomic layer deposition, ion implantation, or plasma vapor deposition, wherein the work function for the P type Epi surface is adjusted to a value of approximately 5.0 eV, wherein the work function for the N type Epi surface is adjusted to a value of approximately 3.8 eV, and/or selectively depositing the metal silicide layer on the Epi surface prior to deposition of a contact etch stop layer and performing an activation anneal after adjusting the metal-to-silicon ratio.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods of the present principles enable formation of highly conductive contacts that facilitate in increasing the speed and lowering the operating voltages of semiconductor devices such as, but not limited to, metal-on-semiconductor (MOS) transistors and the like. The methods create the optimal work function for silicides specific to N type or P type MOS contacts by adding metal or silicon source before, during, or after the deposition process of the MOS to alter the metal-to-silicon composition in the metal silicide. N type or P type contacts require different work function metals to achieve a low Schottky barrier height (SBH). A single metal silicide with fixed work function cannot achieve low SBH for both N type and P type contacts. A tunable work function metal silicide as found in the present methods can adjust the work functions to target the lowest contact resistance for N type and P type separately.

The methods have the advantages of using a single metal without separate metal processes to achieve dual silicide, and the silicon content can be easily adjusted by adding more cycles of silicon (Si) precursor, epitaxial (Epi) Si layer, Si implantation, or plasma vapor deposition (PVD) Si layer. The present methods, in alternative processes, have advantages in that metal content can be adjusted by additional atomic layer deposition (ALD) cycles of metal precursor, PVD metal layer, metal implantation, or CVD metal deposition while using the same metal silicide with different metal-to-silicon ratio for N type and P type contacts. The metals used in the present method also have the advantages of low deposition temperatures (e.g., under approximately 150 degrees Celsius), high thermal stability, and selective deposition. Lower deposition temperatures have the advantage of preserving the thermal budget of structures already formed on a substrate before the present methods are performed.

Traditional approaches rely on a single work function silicide for both N type and P type contacts or by depositing a different metal on either N type or P type Epi surfaces to achieve different silicides for N type and P type contacts. In the present methods, a single metal can be used to lower the resistance of the N type or P type contacts by changing the silicon content in the metal silicide to achieve different work functions. In brief, a pre-clean process is used to remove any oxide from silicon, silicon phosphide (SiP), or silicon germanium (SiGe) source/drain Epi surfaces inside contact trenches which is followed by depositing a metal from a metal precursor on the Epi surfaces inside the contact trenches. Silicon is then deposited from a silicon precursor on the same surfaces to form metal silicide. The deposition processes are repeated until a desirable silicide thickness is achieved. The metal-to-silicon ratio can also be modulated by changing the duty cycle of the depositions until the desirable work function of the silicide is achieved. Additional metal or silicon cycles, implantation, or PVD metal or silicon can be added in the beginning or at the end of the silicide formation to adjust the metal-to-silicon ratio. An optional anneal process may be used to further reduce the resistivity of the silicide.

Due to the high thermal stability of the metal silicide used in the present methods, a thermally stable, conformal, and selective silicide material can be deposited before the formation of the contact etch stop layer (CESL). The silicide material can withstand high temperature rapid melt growth (RMG) anneal and other thermal processing. Silicide wrapping around the source and drain Epi surfaces provides a substantially larger surface area than silicide inside the contact trench on the top facets of the source/drain Epi surfaces. The silicide with proper capping can also reduce the dopant out diffusion and retains high dopant concentration at the interface for low contact resistance. The silicide of the present methods has high thermal stability and good selectivity that enables the silicide to be deposited before a nitride etch stop layer and a metal gate anneal. Existing titanium-based silicide cannot withstand an RMG anneal and cannot be used for the early silicide deposition processes.

Traditional approaches deposit silicide after a contact is opened, limiting the contact area to the area of the contact opening. The present methods allow silicide to cover the entire Epi surface of the source/drain contacts and provide a conduction path for contact that reaches down below the Epi facets, substantially increasing the contact area and lowering the contact resistivity. In brief, the present methods deposit a selective metal silicide on the source/drain Epi surfaces using, for example but not limited to, ALD deposition and the like. After, the deposition of the selective metal silicide, an activation anneal is performed. The Epi surface and metal silicide depositions may be performed in the same platform or integrated tool, without a vacuum break. The metal silicide remains stable up to 1100 degrees Celsius or more. Alternatively, the activation anneal may be performed on the source/drain Epi surfaces prior to the selective deposition of the metal silicide.

Figure 1:
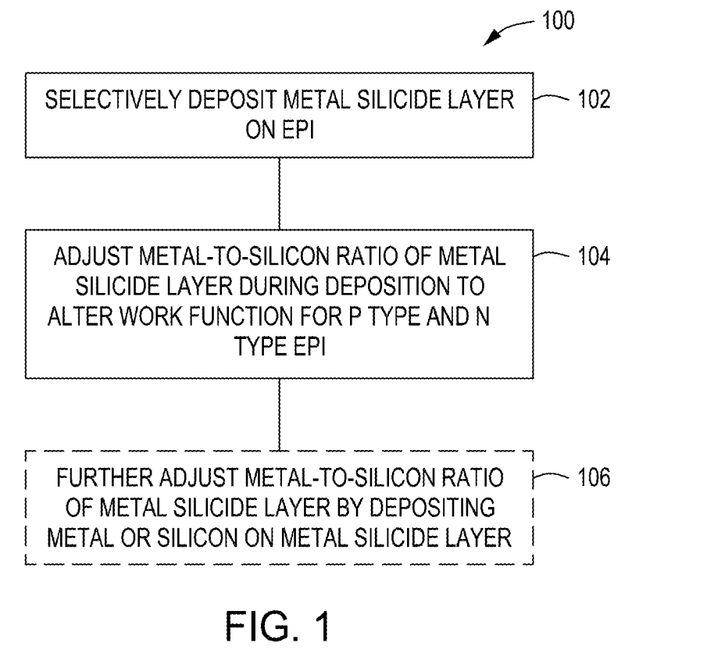
FIG. 1 is a method of reducing interface resistance of an Epi surface in accordance with some embodiments of the present principles.
Figure 2:
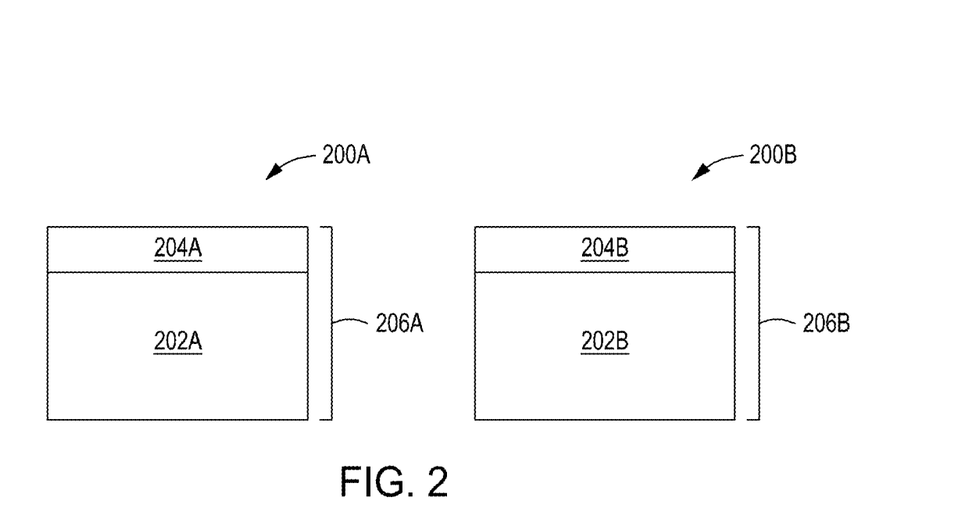
FIG. 2 depicts a cross-sectional view of an Epi surface in accordance with some embodiments of the present principles.

For the sake of brevity, surfaces of epitaxially grown structures or "Epi surfaces" or further abbreviated as "Epi" described herein may include surfaces of source/drain Epi structures of MOS transistors and/or other semiconductor structures and the like. However, the methods of the present principles may be used to reduce interface resistance between Epi surfaces and metal layers of other structures and the like. FIG. 1 is a method 100 of reducing interface resistance of an Epi surface on a substrate in accordance with some embodiments. FIGS. 2-5 are referenced during the discussion of the method 100 for illustrative purposes. In a view 200A of FIG. 2, a P type Epi surface 206A includes an epitaxially grown source/drain material such as, for example, SiGe layer 202A of approximately 30 nm to approximately 40 nm in thickness and may also include a silicon cap layer 204A of approximately 1 nm to approximately 10 nm in thickness. In a view 200B of FIG. 2, an N type Epi surface 206B includes an epitaxially grown source/drain material such as, for example, SiP layer 202B of approximately 30 nm to approximately 40 nm in thickness and may include a molybdenum (Mo) cap layer 204B of approximately 1 nm to approximately 10 nm in thickness. In block 102 of the method 100, a metal silicide layer is deposited on the Epi surface. The deposition processes have low temperatures of less than approximately 150 degrees Celsius. In some embodiments, the deposition processes have a deposition temperature of approximately 120 degrees Celsius. The metal silicide layer may be molybdenum silicide or ruthenium silicide, and the like. The deposition process may be an ALD process, and the deposition of the metal silicide layer may be from approximately 5 nm to approximately 10 nm in thickness. In some embodiments, the thickness of the metal silicide layer is from approximately 6 nm to approximately 8 nm. The deposition process includes depositing a metal from a metal precursor on the Epi surface and depositing silicon from a silicon precursor on the Epi surface to form the metal silicide layer. The deposition processes may be repeated until a desirable metal silicide thickness is achieved.

In block 104, the metal-to-silicon ratio of the metal silicide layer is adjusted during deposition of the metal silicide layer to alter the work function based on whether the Epi surface is a P type or an N type. The amount of deposition of silicon and the amount of deposition of the metal can be altered to achieve a desired work function based on the metal-to-silicon ratio. In some embodiments, the metal-to-silicon ratio can be modulated by an ALD process with different amounts of molybdenum hexafluoride (MoF$_6$) and disilane (H$_6$Si$_2$) or trisilane (H$_2$Si(SiH$_3$)$_2$) precursors in the deposition process. The metal-to-silicon ratio can also be modulated by changing the duty cycle of the depositions of silicon and the metal until the desired work function of the metal silicide layer is achieved. Additional metal or silicon cycles, implantation, or PVD metal or silicon can be added in the beginning or at the end of the silicide formation (see optional block 106 below) to adjust the metal-to-silicon ratio. An optional anneal step may be used to further reduce the resistivity of the metal silicide.

Figure 3:
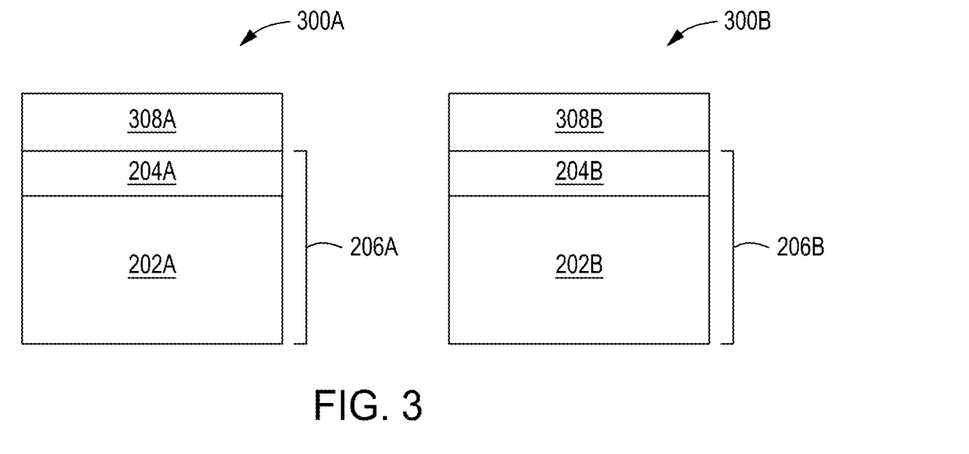
FIG. 3 depicts a cross-sectional view of an Epi surface with a metal silicide layer in accordance with some embodiments of the present principles.
Figure 4:
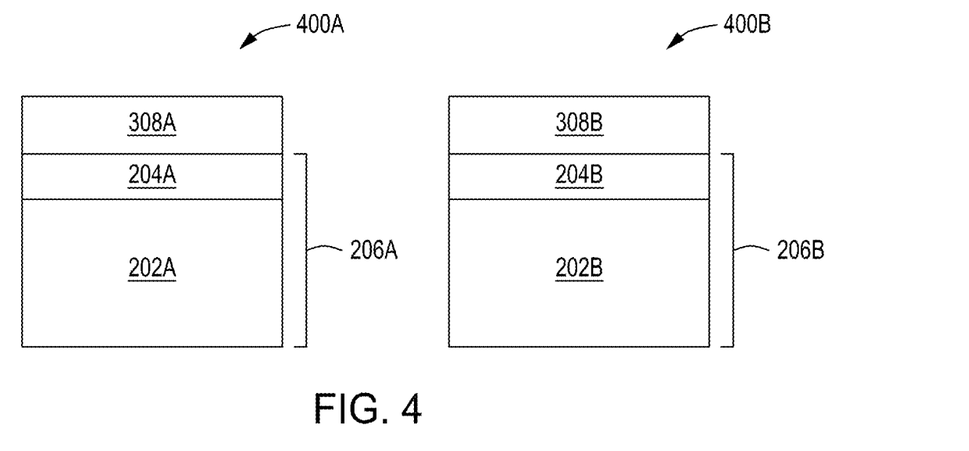
FIG. 4 depicts a cross-sectional view of an Epi surface with metal silicide diffused into a silicon cap layer in accordance with some embodiments of the present principles.

In a view 300A of FIG. 3, the metal silicide layer may be, for example, a P type Mo$_x$Si$_y$ layer 308A deposited on the P type Epi surface 206A. In a view 300B of FIG. 3, the metal silicide layer may be, for example, an N type Mo$_x$Si$_y$ layer 308B deposited on the N type Epi surface 206B. The P type Mo$_x$Si$_y$ layer 308A and the N type Mo$_x$Si$_y$ layer 308B advantageously utilize the same metal and silicon composition but at different metal-to-silicon ratios to alter the work function of the deposited metal silicide according to whether the Epi surface is a P type or an N type (x>y for N type and y>x for P type). In a view 400A of FIG. 4, the P type Mo$_x$Si$_y$ layer 308A diffuses into the silicon cap layer 204A during deposition creating a silicide layer of Mo$_a$Si$_b$. In a view 400B of FIG. 4, the N type Mo$_x$Si$_y$ layer 308B diffuses into the molybdenum cap layer 204B during deposition creating a silicide layer of Mo$_a$Si$_b$. The ratio of 'a' and 'b' are different for the N type Epi surface 206B and the P type Epi surface 206A where a>b for N type and b>a for P type.

Higher metal concentrations over silicon concentrations are used for N type Epi surfaces and higher silicon concentrations over metal concentrations are used for P type Epi surfaces. The work function can be adjusted to yield a Schottky barrier height of less than 0.5 eV for P type Epi surfaces (work function of greater than approximately 4.6 eV) or N type Epi surfaces (work function of less than approximately 4.2 eV). In some embodiments, the work function can be adjusted to yield a Schottky barrier height of approximately 0.3 eV or less for P type Epi surfaces (work function of approximately 5.0 eV) or N type Epi surfaces (work function of approximately 3.8 eV), A low Schottky barrier height means a higher amount of current may flow, indicating a lower overall contact resistance. The metal-to-contact ratio may attain a desired ratio after deposition of the Mo$_x$Si$_y$ layer, and the adjustment of work function (metal-to-silicon ratio), Mo$_a$Si$_b$, may be completed. If a desired metal-to-contact ratio is not achieved through deposition of the Mo$_x$Si$_y$ layer, the process may continue to an optional block 106.

Figure 5:
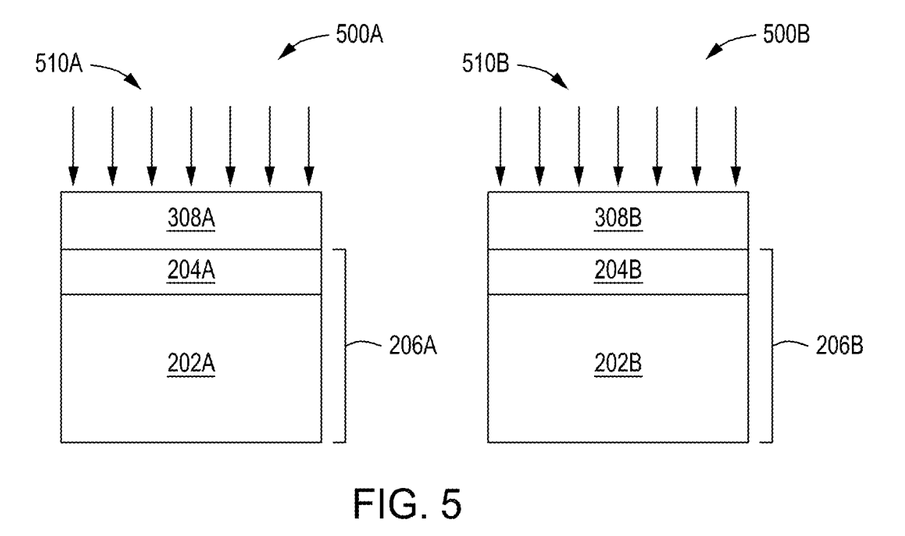
FIG. 5 depicts a cross-sectional view of an Epi surface with a work unction of a metal silicide layer being adjusted in accordance with some embodiments of the present principles.

In optional block 106, the metal-to-silicon ratio of the deposited metal silicide layer may be further adjusted by depositing metal or silicon on the deposited metal silicide layer on the Epi surface as depicted in FIG. 5. The metal or silicon may be deposited using ALD, ion implantation, or PVD based processes and the like. In a view 500A, silicon or metal is deposited 510A on the metal silicide (P type Mo$_x$Si$_y$ layer 308A) to further adjust the work function as necessary to achieve a lower Schottky barrier height and subsequently lower interface resistivity. In a view 500B, silicon or metal is deposited 510B on the metal silicide (N type Mo$_x$Si$_y$ layer 308B) to further adjust the work function as necessary to achieve a lower Schottky barrier height and subsequently lower interface resistivity. In some embodiments, the further adjustment process may be performed prior to the selective deposition of the metal silicide on the Epi surface (block 102).

Figure 6:
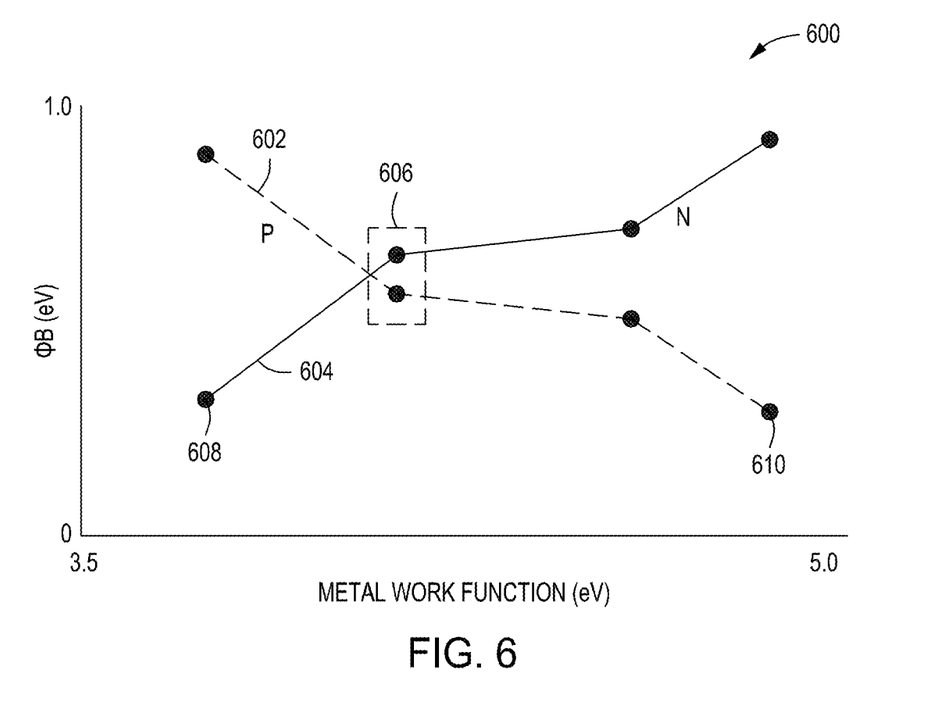
FIG. 6 is a graph of work functions for a tunable metal silicide layer in accordance with some embodiments of the present principles.

A graph 600 of FIG. 6 depicts Schottky barrier values on the Y-axis versus metal work function values on the X-axis with various work function points that are possible by varying the metal-to-silicon ratio of the metal silicide (e.g., molybdenum silicide, ruthenium silicide, etc.). The contact resistance, $R_c$, is related to the Schottky barrier, $\phi_B$, based on the following equation 1:

$$R_c = C_1 \exp\left(C_2 \frac{q\varphi_a}{\sqrt{N_{if}}}\right) \times Area^{-1} \qquad \text{(Eq. 1)}$$

A reduction in Schottky barrier height results in a reduction in contact resistance (interface resistance between an Epi surface and a metal material). In some embodiments, the reduction in interface resistance may be 30% or more over conventional techniques such as titanium silicide and the like.

The first work function line 602 indicates possible work function values for a metal silicide composition of the present methods deposited on P type Epi surfaces. The second work function line 604 indicates possible work function values for the metal silicide composition of the present methods deposited on N type Epi surfaces. The points within a dashed box 606 indicate work function values for a fixed work function metal silicide used conventionally such as titanium silicide on P type Epi surfaces or N type Epi surfaces (work function is the same for both contact types). For the titanium silicide, the work function cannot be altered and results in less than optimal Schottky barrier heights, leading to higher interface resistance. Because the metal silicide of the present methods has a tunable work function, the same metal silicide can be used for both P type Epi surfaces and N type Epi surfaces and adjusted accordingly. For N type Epi surfaces, a first indicated point 608 depicts a possible work function value of approximately 3.8 eV with a Schottky barrier height of less than or equal to approximately 0.3 eV. For P type Epi surfaces, a second indicated point 610 depicts a possible work function value of approximately 5.0 eV with a Schottky barrier height of less than or equal to approximately 0.3 eV.

Figure 7:
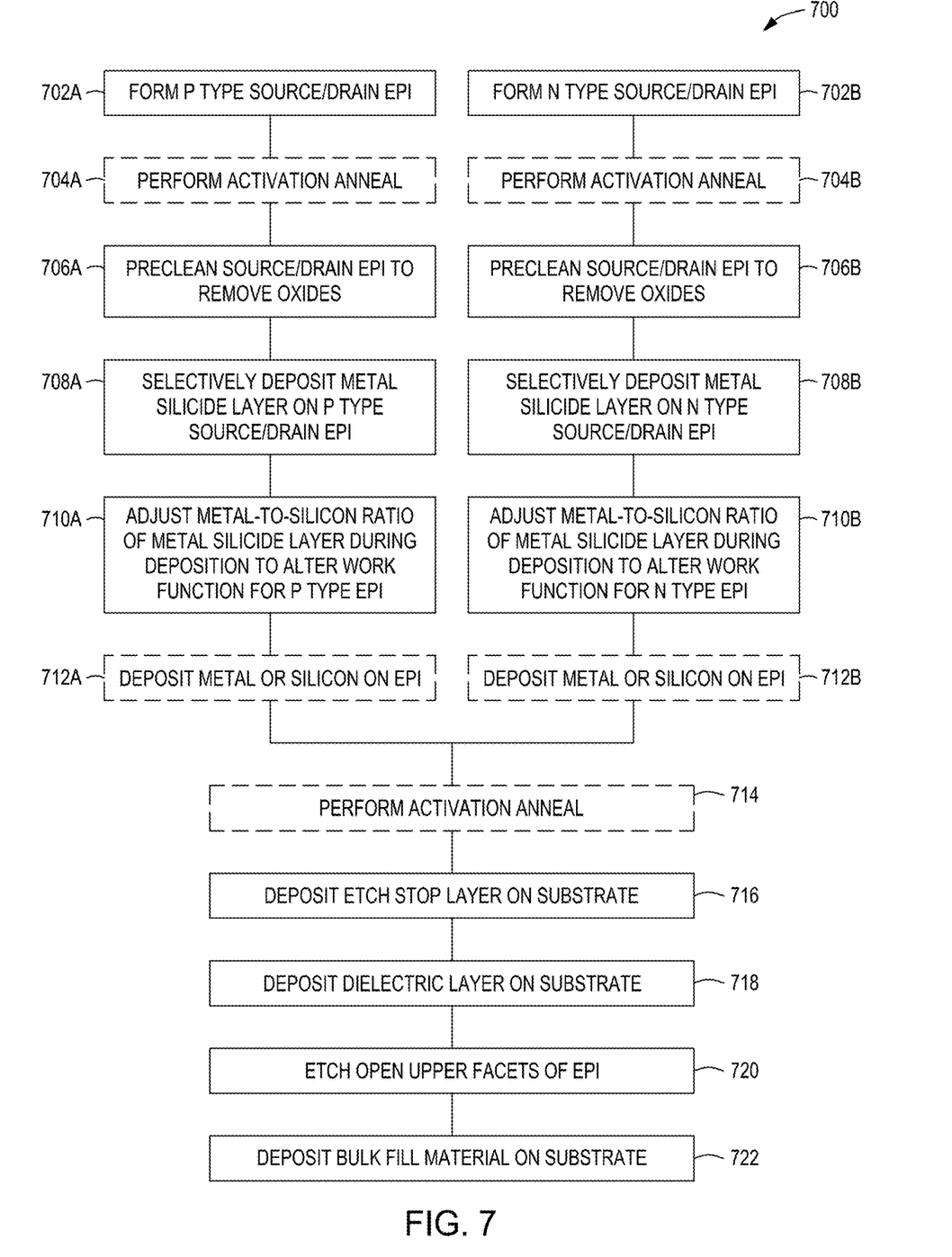
FIG. 7 is a method of reducing interface resistance between an Epi surface and metal contacts using adjustable work functions of a metal silicide layer and an increased metal silicide layer contact area in accordance with some embodiments of the present principles.
Figure 8A:
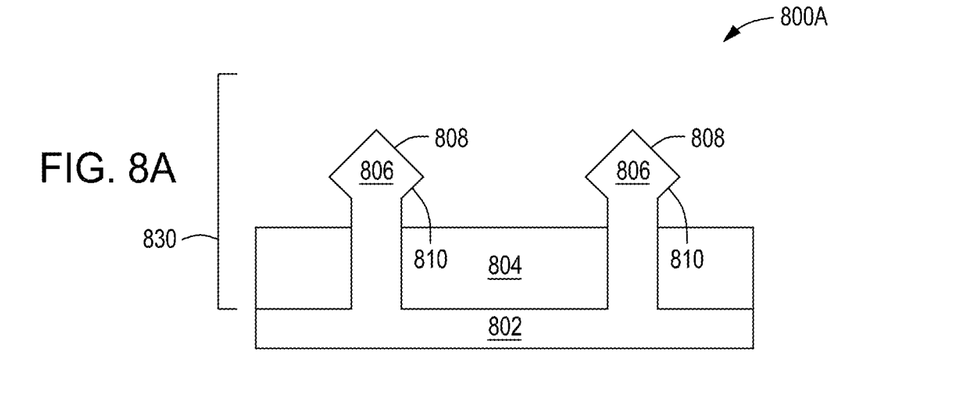
FIG. 8A depicts a cross-sectional view of source/drain Epi surfaces formed on a substrate in accordance with some embodiments of the present principles.
Figure 8B:
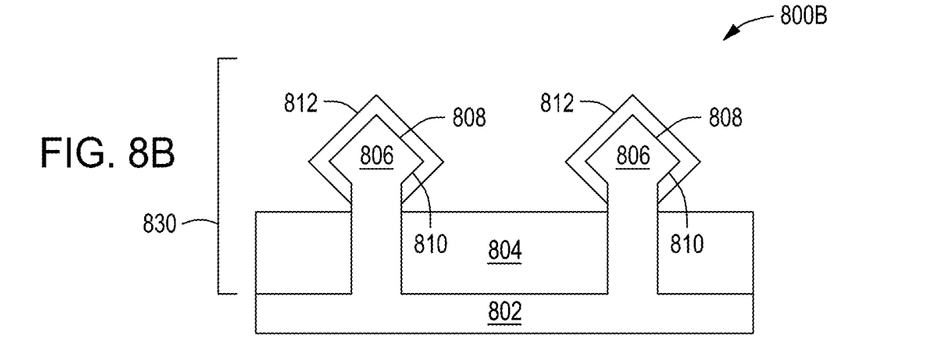
FIG. 8B depicts a cross-sectional view of source/drain Epi surfaces with a wraparound metal silicide layer in accordance with some embodiments of the present principles.
Figure 8C:
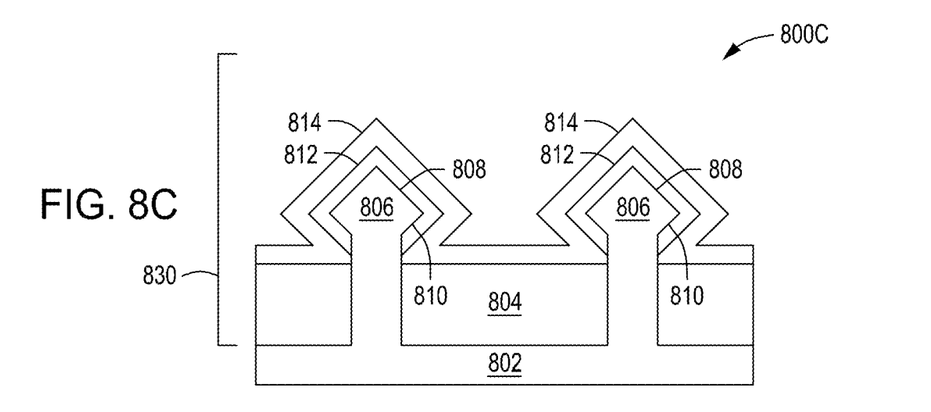
FIG. 8C depicts a cross-sectional view of source/drain Epi surfaces with an etch stop layer in accordance with some embodiments of the present principles.
Figure 8D:
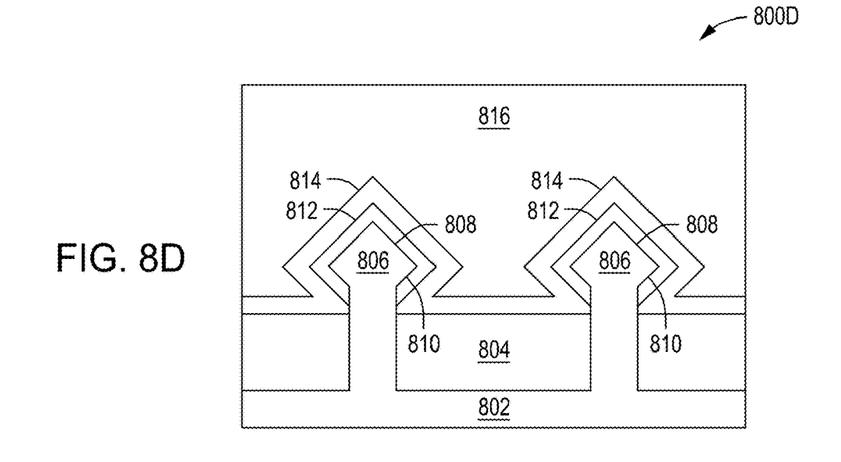
FIG. 8D depicts a cross-sectional view of source/drain Epi surfaces with a dielectric layer in accordance with some embodiments of the present principles.
Figure 8E:
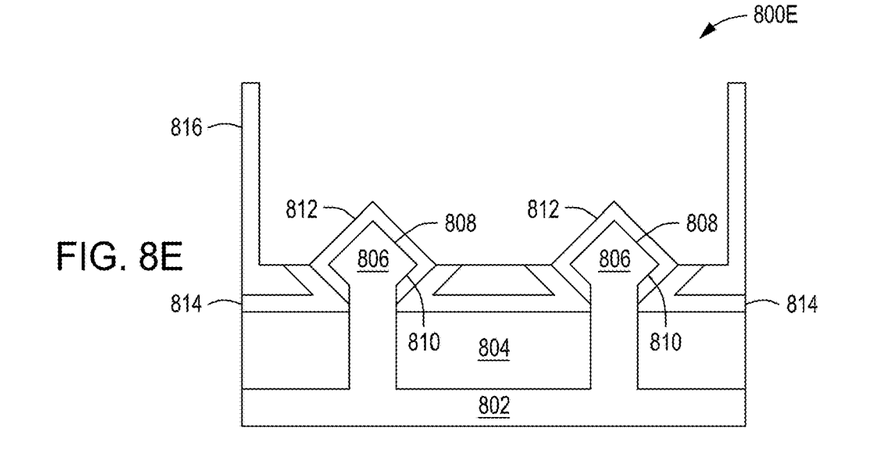
FIG. 8E depicts a cross-sectional view of source/drain Epi surfaces after etching of the dielectric layer in accordance with some embodiments of the present principles.
Figure 8F:
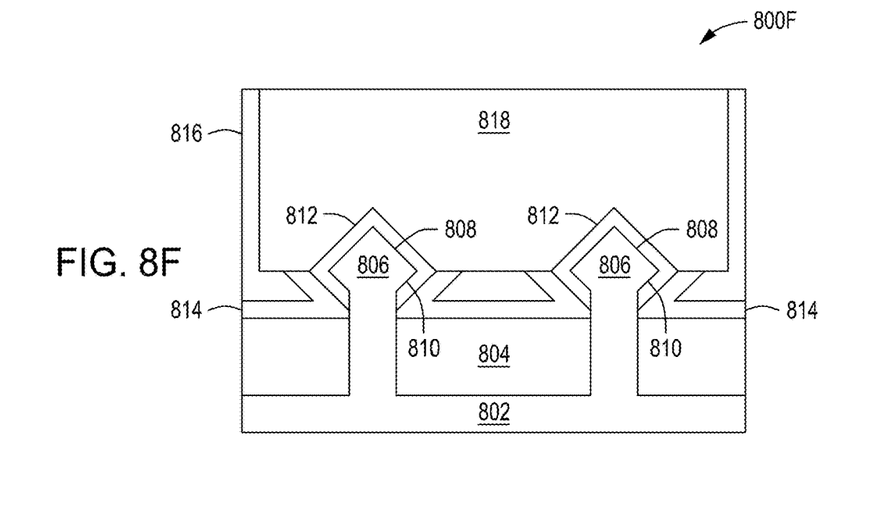
FIG. 8F depicts a cross-sectional view of source/drain Epi surfaces after a bulk fill layer has been deposited in accordance with some embodiments of the present principles.

The inventors have found that the metal silicide of the present methods is thermally stable up to temperatures of approximately 1100 degrees Celsius (for spike annealing) or more. The thermal stability allows the deposition of the metal silicide at several places within the MOS processes without concern for when high temperature annealing processes such as activation annealing occur. The thermal characteristics of the metal silicide advantageously allows flexibility in the use of the metal silicide to further reduce the interface resistivity through increased contact surface area with the metal silicide layer. FIG. 7 is a method 700 of reducing interface resistance between Epi surfaces and metal contacts through work function adjustments and also through increased contact surface area with the metal silicide layer. References to FIGS. 8A to 8F are used to illustrate processes of the method 700. In some embodiments, a substrate may have P type source/drain Epi surfaces and also N type source/drain Epi surfaces. The upper flow portion of method 700 denotes the processes that are specific to P type source/drain Epi surfaces (702A-712A) and the processes that are specific to N type source/drain Epi surfaces (702B-712B). The upper flow portion does not denote that the P type processes and the N type processes are performed simultaneously. The P type source/drain Epi surface processes may be performed before or after the N type source/drain Epi surface processes. After completion of the P type and N type specific processes, the remaining processes (714-722) may be performed on both the P type source/drain Epi surfaces and the N type source/drain Epi surfaces simultaneously. For substrates with only P type source/drain Epi surfaces, the N type source/drain Epi surface processes (702B-712B) will not be performed. For substrates with only N type source/drain Epi surfaces, the P type source/drain Epi surface processes (702A-712A) will not be performed.

The following processes apply for substrates with P type structures. In block 702A, one or more P type source/drain Epi surfaces are formed. In a view 800A of FIG. 8A, a trench 830 has source/drain Epi surfaces 806 formed from, for example and not meant to be limiting, SiGe and the like for P type Epi surfaces. The source/drain Epi surfaces 806 are grown from a layer 802 on the substrate and isolated within shallow trench isolation (STI) 804. In the example, the source/drain Epi surfaces 806 have upper facets 808 and lower facets 810 (which are undercut surfaces). In optional block 704A, an activation anneal may performed prior to metal silicide layer formations or after metal silicide formations as indicated by optional block 714. In some embodiments, the activation anneal may include a spike anneal that may be performed at a temperature of approximately 1100 degrees Celsius. In block 706A, a preclean process is performed to remove any contamination and oxides from silicon or SiGe source/drain Epi surfaces inside the trench 830. In block 708A (see also block 102 of method 100 of FIG. 1), a metal silicide layer 812 is selectively deposited on the upper facets 808 and the lower facets 810 of the source/drain Epi surfaces 806 as depicted in a view 800B of FIG. 8B. The selective deposition includes selectively depositing a metal from a metal precursor on the source/drain Epi surfaces inside the trench 830 and selectively depositing silicon from a silicon precursor onto the same surfaces to form the metal silicide layer 812 that envelopes or wraps around the source/drain Epi surfaces 806. The selective deposition processes are repeated until a desirable metal silicide thickness is achieved.

In block 70A (see also block 104 of method 100 of FIG. 1), the metal-to-silicon ratio of the metal silicide layer is adjusted during deposition to alter the work function based on the source/drain Epi surfaces 806 being a P type Epi surface. The amount of deposition of silicon and the amount of deposition of the metal can be altered to achieve a desired work function based on the metal-to-silicon ratio. The metal-to-silicon ratio can also be modulated by changing the duty cycle of the depositions of silicon and the metal until the desirable work function of the metal silicide layer is achieved. Additional metal or silicon cycles, implantation, or PVD metal or silicon can be added in the beginning or at the end of the silicide formation (see optional block 712A) to adjust the metal-to-silicon ratio. An optional anneal process may be used to further reduce the resistivity of the metal silicide. In optional block 712A, the metal-to-silicon ratio of the deposited metal silicide layer may be further adjusted by depositing metal or silicon on the deposited metal silicide layer on the source/drain Epi surfaces 806. The metal or silicon may be deposited using ALD, ion implantation, or PVD based processes and the like. In some embodiments, the further adjustment process may be performed prior to the selective deposition of the metal silicide on the source/drain Epi surfaces (block 708A).

The following processes apply for substrates with N type structures. In block 702B, one or more N type source/drain Epi surfaces are formed. In the view 800A of FIG. 8A, the trench 830 has source/drain Epi surfaces 806 formed from, for example and not meant to be limiting, SiP and the like for N type Epi surfaces. The source/drain Epi surfaces 806 are grown from the layer 802 on the substrate and isolated within shallow trench isolation (STI) 804. In the example, the source/drain Epi surfaces 806 have upper facets 808 and lower facets 810 (which are undercut surfaces). In optional block 704B, an activation anneal may performed prior to metal silicide layer formations or after metal silicide formations as indicated by optional block 714. In some embodiments, the activation anneal may include a spike anneal that may be performed at a temperature of approximately 1100 degrees Celsius. In block 706B, a preclean process is performed to remove any contamination and oxides from silicon or SiP source/drain Epi surfaces inside the trench 830. In block 708B (see also block 102 of method 100 of FIG. 1), the metal silicide layer 812 is selectively deposited on the upper facets 808 and the lower facets 810 of the source/drain. Epi surfaces 806 as depicted in a view 800B of FIG. 8B. The selective deposition includes selectively depositing a metal from a metal precursor on the source/drain Epi surfaces inside the trench 830 and selectively depositing silicon from a silicon precursor onto the same surfaces to form the metal silicide layer 812 that envelopes or wraps around the source/drain Epi surfaces 806. The selective deposition processes are repeated until a desirable metal silicide thickness is achieved.

In block 710B (see also block 104 of method 100 of FIG. 1), the metal-to-silicon ratio of the metal silicide layer is adjusted during deposition to alter the work function based on the source/drain Epi surfaces 806 being N type Epi surfaces. The amount of deposition of silicon and the amount of deposition of the metal can be altered to achieve a desired work function based on the metal-to-silicon ratio. The metal-to-silicon ratio can also be modulated by changing the duty cycle of the depositions of silicon and the metal until the desirable work function of the metal silicide layer is achieved. Additional metal or silicon cycles, implantation, or PVD metal or silicon can be added in the beginning or at the end of the silicide formation (see optional block 712B) to adjust the metal-to-silicon ratio. An optional anneal process may be used to further reduce the resistivity of the metal silicide. In optional block 712B, the metal-to-silicon ratio of the deposited metal silicide layer may be further adjusted by depositing metal or silicon on the deposited metal silicide layer on the source/drain Epi surfaces 806. The metal or silicon may be deposited using ALD, ion implantation, or PVD based processes and the like. In some embodiments, the further adjustment process may be performed prior to the selective deposition of the metal silicide on the source/drain Epi surfaces (block 708B).

The following processes apply for substrates with N type structures, P type structures, or both. In optional block 714, as discussed above, an activation anneal may be performed after the deposition of the metal silicide layer 812 or prior to the deposition of the metal silicide layer 812 (see optional block 704). If the activation anneal is performed after the metal silicide formation and adjustment, the source/drain Epi surface and metal silicide depositions and work function tuning may be performed in the same platform or integrated tool, and, in addition, may be performed without a vacuum break (see, e.g., integrated tool 1000 of FIG. 10 below), resulting in lower costs and higher yields. The metal silicide wrapping around the source/drain. Epi surfaces provides a substantially larger surface area than silicide inside the contact trench on top of the source/drain Epi surfaces as found in traditional methods. The metal silicide with proper capping can also reduce the dopant out diffusion and retains high dopant concentration at the interface for low contact resistance. The silicide of the present methods has high thermal stability and good selectivity that enables the metal silicide to be deposited before a nitride etch stop layer and a metal gate anneal. In block 716, an etch stop layer 814 for the source/drain. Epi surfaces 806 is deposited on the substrate as depicted in a view 800C of FIG. 8C. The etch stop layer 814 may be a nitride layer such as, for example, a silicon nitride layer that is conformally deposited on the source/drain Epi surfaces in the trench 830. In block 718, a dielectric layer 816 is deposited on the substrate filling the trench 830 as depicted in a view 800D of FIG. 8D. In some embodiments, the dielectric layer 816 may be a silicon dioxide layer and the like. In block 720, the upper facets 808 of the source/drain Epi surfaces 806 are opened as depicted in a view 800E of FIG. 8E. The opening is achieved by etching the dielectric layer 816 and a portion of the etch stop layer 814 to expose the metal silicide layer 812 on the upper facets 808 of the source/drain Epi surfaces 806. In block 722, a bulk fill material is deposited in the trench 830 on the substrate as depicted in a view 800F of FIG. 8F. In some embodiments, the bulk fill material may be cobalt-based material and the like.

Figure 9:
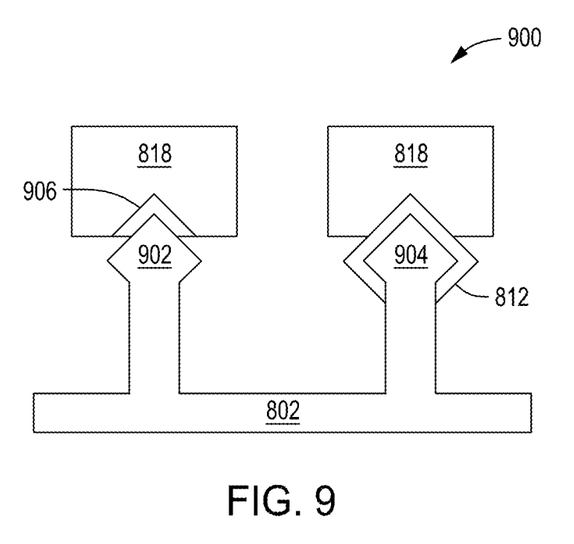
FIG. 9 depicts a cross-sectional view of different metal silicide into face areas in accordance with some embodiments of the present principles.

In a view 900 of FIG. 9, a comparison of source/drain Epi structures is depicted. A traditionally constructed source/drain Epi structure 902 has only an upper surface portion in contact with a silicide layer 906 which in turn contacts the bulk fill material 818. A source/drain Epi structure 904 constructed using the present methods yields a source/drain Epi structure 904 with a metal silicide layer wrapped around the source/drain Epi surfaces. The amount of additional surface area in contact with the silicide in structures of the present methods is approximately 70% or more greater than that found in traditional structures. The inventors have discovered that even when the contact area of the bulk fill material 818 in contact with the silicide may be the same for both the source/drain Epi structure 902 of the traditional structure and the source/drain Epi structure 904 of the present methods structure, the current flow is substantially greater in the source/drain Epi structure 904 of the present methods structure by as much as approximately 40% or more (and subsequently the interface resistance is also substantially lower).

Figure 10:
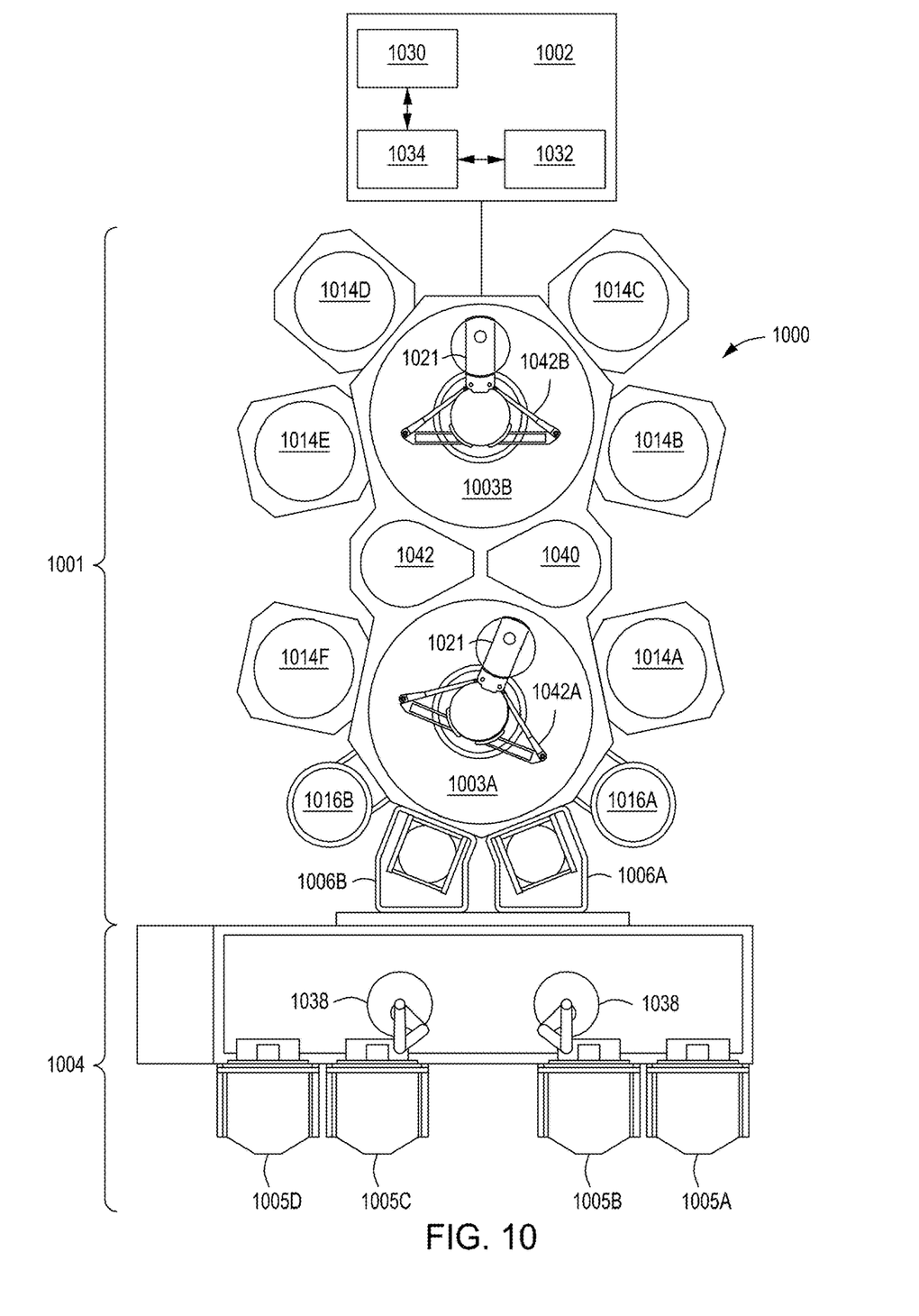
FIG. 10 depicts a top down view of an integrated tool in accordance with some embodiments of the present principles.

The methods described herein may be performed in individual process chambers that may be provided in a standalone configuration or as part of a cluster tool, for example, an integrated tool 1000 (i.e., cluster tool) described below with respect to FIG. 10. The advantage of using an integrated tool 1000 is that there is no vacuum break and, therefore, no requirement to degas and pre-clean a substrate before treatment. In some embodiments, the present methods discussed above may advantageously be performed in an integrated tool such that there are limited or no vacuum breaks between processes, reducing vacuum breaks may limit or prevent contamination of the substrate as well as increase the throughput of the processes. The integrated tool 1000 includes a processing platform 1001 that is vacuum-tight, a factory interface 1004, and a system controller 1002. The processing platform 1001 comprises multiple processing chambers, such as 10110A, 1014B, 1014C, 1014D, 1014E, and 1014F operatively coupled to a vacuum substrate transfer chamber (transfer chambers 1003A, 1003B). The factory interface 1004 is operatively coupled to the transfer chamber 1003A by one or more load lock chambers (two load lock chambers, such as 1006A and 1006B shown in FIG. 10).

In some embodiments, the factory interface 1004 comprises at least one docking station 1007, at least one factory interface robot 1038 to facilitate the transfer of the semiconductor substrates. The docking station 1007 is configured to accept one or more front opening unified pod (FOUP). Four FOUPS, such as 1005A, 1005B, 1005C, and 1005D are shown in the embodiment of FIG. 10. The factory interface robot 1038 is configured to transfer the substrates from the factory interface 1004 to the processing platform 1001 through the load lock chambers, such as 1006A and 1006B. Each of the load lock chambers 1006A and 1006B have a first port coupled to the factory interface 1004 and a second port coupled to the transfer chamber 1003A. The load lock chamber 1006A and 1006B are coupled to a pressure control system (not shown) which pumps down and vents the load lock chambers 1006A and 1006B to facilitate passing the substrates between the vacuum environment of the transfer chamber 1003A and the substantially ambient (e.g., atmospheric) environment of the factory interface 1004. The transfer chambers 1003A, 1003B have vacuum robots 1042A, 1042B disposed in the respective transfer chambers 1003A, 1003B. The vacuum robot 1042A is capable of transferring substrates 1021 between the load lock chamber 1006A, 1006B, the processing chambers 1014A and 1014F and a cooldown station 1040 or a pre-clean station 1042. The vacuum robot 1042B is capable of transferring substrates 1021 between the cooldown station 1040 or pre-clean station 1042 and the processing chambers 10148, 1014C, 1014D, and 1014E.

In some embodiments, the processing chambers 1014A, 10148, 1014C, 1014D, 1014E, and 1014F are coupled to the transfer chambers 1003A, 1003B. The processing chambers 1014A, 10148, 1014C, 1014D, 1014E, and 1014F comprise at least an atomic layer deposition (ALD) process chamber, a chemical vapor deposition (CVD) process chamber, an ion implantation chamber, and a physical vapor deposition (PVD) process chamber. Additional chambers may also be provided such as annealing chambers, additional CVD chambers, additional ALD chambers, additional PVD chambers, or the like. ALD, CVD, ion implantation, and PVD chambers may include any chambers suitable to perform all or portions of the methods described herein, as discussed above. In some embodiments, one or more optional service chambers (shown as 1016A and 1016B) may be coupled to the transfer chamber 1003A. The service chambers 1016A and 1016B may be configured to perform other substrate processes, such as degassing, orientation, substrate metrology, cool down and the like.

The system controller 1002 controls the operation of the integrated tool 1000 using a direct control of the process chambers 1014A, 1014B, 1014C, 1014D, 1014E, and 1014F or alternatively, by controlling the computers (or controllers) associated with the process chambers 1014A, 10148, 1014C, 1014D, 1014E, and 1014F and the integrated tool 1000. In operation, the system controller 1002 enables data collection and feedback from the respective chambers and systems to optimize performance of the integrated tool 1000. The system controller 1002 generally includes a Central Processing Unit (CPU) 1030, a memory 1034, and a support circuit 1032. The CPU 1030 may be any form of a general-purpose computer processor that can be used in an industrial setting. The support circuit 1032 is conventionally coupled to the CPU 1030 and may comprise a cache, clock circuits, input output subsystems, power supplies, and the like.

Software routines, such as the methods as described above may be stored in the memory 1034 and, when executed by the CPU 1030, transform the CPU 1030 into a specific purpose computer (system controller 1002). The software routines may also be stored and/or executed by a second controller (not shown) that is located remotely from the integrated tool 1000.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for reducing interface resistance between an Epi surface and a contact material, comprising:
    selectively depositing a metal silicide layer on the Epi surface at a deposition temperature of approximately 150 degrees Celsius or less, wherein the metal silicide layer is deposited by selectively depositing a metal from a metal precursor and silicon from a silicon precursor to form the metal silicide layer on the Epi surface; and
    adjusting a metal-to-silicon ratio of the metal silicide layer during deposition of the metal silicide layer to alter a work function of the metal silicide layer based on whether the Epi surface is a P type Epi surface or an N type Epi surface to achieve a Schottky barrier height of less than or equal to approximately 0.3 eV for the P type Epi surface or the N type Epi surface.

2. The method of claim 1, wherein the metal silicide layer is a molybdenum silicide-based material or a ruthenium silicide-based material.

3. The method of claim 1, wherein the work function for the P type Epi surface is adjusted to a value of approximately 5.0 eV.

4. The method of claim 1, wherein the work function for the N type Epi surface is adjusted to a value of approximately 3.8 eV.

5. The method of claim 1, further comprising:
    depositing the metal silicide layer using atomic layer deposition.

6. The method of claim 1, further comprising:
    further adjusting the metal-to-silicon ratio by depositing on the metal silicide layer a metal or silicon using atomic layer deposition, ion implantation, or plasma vapor deposition.

7. The method of claim 1, wherein the P type Epi surface is a silicon germanium material with or without a silicon cap layer or the N type Epi surface is a silicon phosphide material with or without a molybdenum cap layer.

8. The method of claim 1, further comprising:
    selectively depositing the metal silicide layer on the Epi surface prior to deposition of a contact etch stop layer; and adjusting the metal-to-silicon ratio of the metal silicide layer during deposition prior to deposition of the contact etch stop layer.

9. The method of claim 8, further comprising:
performing an activation anneal after adjusting the metal-to-silicon ratio.

10. The method of claim 8, further comprising:
performing an activation anneal prior to selectively depositing the metal silicide layer.

11. The method of claim 8, further comprising:
depositing the contact etch stop layer as a conformal nitride-based etch stop layer on a substrate;
depositing a dielectric layer on the substrate;
opening a contact on the substrate; and
depositing a bulk fill material onto the contact.

12. A method for reducing interface resistance between an Epi surface and a contact material, comprising:
selectively depositing a molybdenum silicide layer on the Epi surface using atomic layer deposition at a deposition temperature of approximately 120 degrees Celsius or less, wherein the Epi surface has upper surfaces and undercut surfaces and wherein the molybdenum silicide layer is deposited by selectively depositing molybdenum from a molybdenum precursor and silicon from a silicon precursor onto the upper surfaces and the undercut surfaces of the Epi surface; and
adjusting a metal-to-silicon ratio of the molybdenum silicide layer during deposition to alter a work function of the molybdenum silicide layer based on whether the Epi surface is a P type Epi surface or an N type Epi surface to achieve a Schottky barrier height of less than or equal to approximately 0.3 eV for the P type Epi surface or the N type Epi surface.

13. The method of claim 12, wherein the work function for the P type Epi surface is adjusted to a value of approximately 5.0 eV or the work function for the N type Epi surface is adjusted to a value of approximately 3.8 eV.

14. The method of claim 12, further comprising:
further adjusting the metal-to-silicon ratio by depositing a molybdenum or silicon on the molybdenum silicide layer using atomic layer deposition, ion implantation, or plasma vapor deposition.

15. The method of claim 12, wherein the P type Epi surface is a silicon germanium material with or without a silicon cap layer or the N type Epi surface is a silicon phosphide material with or without a molybdenum cap layer.

16. The method of claim 12, further comprising:
selectively depositing the molybdenum silicide layer on the Epi surface prior to deposition of a contact etch stop layer; and
adjusting the metal-to-silicon ratio of the molybdenum silicide layer prior to deposition of the contact etch stop layer.

17. The method of claim 16, further comprising:
performing an activation anneal after adjusting the metal-to-silicon ratio or prior to selectively depositing the molybdenum silicide layer.

18. A non-transitory, computer readable medium having instructions stored thereon that, when executed, cause a method for reducing interface resistance between an Epi surface and a contact material on a substrate to be performed, the method comprising:
selectively depositing a metal silicide layer on the Epi surface at a deposition temperature of approximately 150 degrees Celsius or less, wherein the metal silicide layer is deposited by selectively depositing a metal from a metal precursor and silicon from a silicon precursor to form the metal silicide layer on the Epi surface; and
adjusting a metal-to-silicon ratio of the metal silicide layer during deposition to alter a work function of the metal silicide layer based on whether the Epi surface is a P type Epi surface or an N type Epi surface to achieve a Schottky barrier height of less than or equal to approximately 0.3 eV for the P type Epi surface or the N type Epi surface.

19. The non-transitory, computer readable medium of claim 18, the method further comprising:
depositing the metal silicide layer using atomic layer deposition; and
adjusting the metal-to-silicon ratio by depositing on the metal silicide layer a metal or silicon using atomic layer deposition, ion implantation, or plasma vapor deposition, wherein the work function for the P type Epi surface is adjusted to a value of approximately 5.0 eV or wherein the work function for the N type Epi surface is adjusted to a value of approximately 3.8 eV.

20. The non-transitory, computer readable medium of claim 18, the method further comprising:
selectively depositing the metal silicide layer on the Epi surface prior to deposition of a contact etch stop layer; and
performing an activation anneal after adjusting the metal-to-silicon ratio.

* * * * *